United States Patent
Wagner et al.

(10) Patent No.: US 9,060,454 B2
(45) Date of Patent: Jun. 16, 2015

(54) PRINTED BOARD ARRANGEMENT

(75) Inventors: Martin Wagner, Steinach (CH); Josef Fuchs, Appenzell (CH)

(73) Assignee: Huber+Suhner AG, Herisau (CH)

( * ) Notice: Subject to any disclaimer, the term of this patent is extended or adjusted under 35 U.S.C. 154(b) by 842 days.

(21) Appl. No.: 13/319,665

(22) PCT Filed: May 17, 2010

(86) PCT No.: PCT/EP2010/056733
§ 371 (c)(1),
(2), (4) Date: Nov. 9, 2011

(87) PCT Pub. No.: WO2010/139549
PCT Pub. Date: Dec. 9, 2010

(65) Prior Publication Data
US 2012/0057320 A1    Mar. 8, 2012

(30) Foreign Application Priority Data
Jun. 2, 2009 (CH) ........................... 0838/09

(51) Int. Cl.
| H01R 12/00 | (2006.01) |
| H05K 3/36 | (2006.01) |
| H01R 12/73 | (2011.01) |
| H05K 1/14 | (2006.01) |

(52) U.S. Cl.
CPC .............. *H05K 3/368* (2013.01); *H01R 12/732* (2013.01); *H01R 12/73* (2013.01); *H05K 1/14* (2013.01)

(58) Field of Classification Search
CPC ........ H01R 9/096; H01R 12/73; H01R 12/732
USPC ............................................................. 439/65
See application file for complete search history.

(56) References Cited

U.S. PATENT DOCUMENTS

| 3,591,834 | A |   | 7/1971 | Kolias |
| 5,263,868 | A | * | 11/1993 | Renn et al. ....................... 439/67 |
| 5,336,095 | A | * | 8/1994 | Walburn et al. ................... 439/67 |
| 6,048,212 | A | * | 4/2000 | Stauble et al. .................... 439/63 |
| 6,109,927 | A | * | 8/2000 | Scholz et al. .................... 439/65 |
| 6,231,352 | B1 |   | 5/2001 | Gonzales |

(Continued)

FOREIGN PATENT DOCUMENTS

| EP | 1 289 076 A2 | 3/2003 |
| JP | 50-125071 | 3/1974 |

(Continued)

*Primary Examiner* — Ramon Barrera
(74) *Attorney, Agent, or Firm* — Pauley Petersen & Erickson

(57) ABSTRACT

The invention relates to a printed circuit board arrangement (20) having at least two printed circuit boards (11; 12'), which are located alongside one another on a common, electrically conductive base plate (13'), have two mutually opposite edges, forming an intermediate space (14), and are connected to one another, bridging the intermediate space (14) by means of electrical connections (21), in order to transmit extremely high frequencies. In the case of a printed circuit board arrangement such as this, RF-compatible electrical connections are made between the printed circuit boards in a simple and space-saving manner when the printed circuit boards are fitted on the base plate and without any further necessary additional tasks or reworking, in that the electrical connections are each made via at least one contact-making element (21), via which the printed circuit boards make detachable electrical contact with one another when mounted on the base plate (13').

19 Claims, 9 Drawing Sheets

(56) References Cited

U.S. PATENT DOCUMENTS

| | | | |
|---|---|---|---|
| 6,464,510 B1 * | 10/2002 | Len | 439/65 |
| 6,612,851 B1 | 9/2003 | Goodwin et al. | |
| 7,121,859 B2 * | 10/2006 | Van Schuylenbergh et al. | 439/260 |
| 7,210,941 B2 | 5/2007 | Rosenberger | |
| 7,416,418 B2 | 8/2008 | Berthet et al. | |
| 2001/0012723 A1 | 8/2001 | Tanaka | |

FOREIGN PATENT DOCUMENTS

| | | |
|---|---|---|
| JP | 2-47889 | 2/1990 |
| JP | 2000-323216 | 11/2000 |
| JP | 2008-177164 | 7/2008 |
| WO | WO 2007/009549 A1 | 1/2007 |

* cited by examiner

PRINTED BOARD ARRANGEMENT

BACKGROUND OF THE INVENTION

1. Field of the Invention

The present invention relates to the field of electronic circuitry in the extremely high frequency region, in the range of operating frequencies up to several GHz. It relates in particular to a printed circuit board arrangement according to the precharacterizing clause of claim 1.

In modern communications technology and in other fields which operate using extremely high frequency, electronic circuits are formed on printed circuit boards (PCBs) which have one or more conductor layers on an electrically insulating supporting board, which conductor layers are structured at least in places and form conductor tracks or surfaces which connect electronic components which are fitted and/or soldered to the supporting board to one another and/or to the outside world.

In the case of relatively large appliance units such as base stations for mobile radio technology, a plurality of separate printed circuit boards are accommodated in one appliance and must be electrically connected to one another after or during installation in the appliance. Many of the required connections must in this case be RF-compatible, in order to allow signals to be reliably passed on from one printed circuit board to the other at high operating frequencies in the GHz range. In principle, such retrospective connections can be soldered, but this involves a considerable amount of labour, particularly when a large number of such connections must be made. It is also possible to make the connections by short lines with plug connectors, although this is likewise associated with considerable labour and in addition occupies a not insignificant space.

2. Discussion of Related Art

If the printed circuit boards to be connected are arranged one above the other or at least partially overlapping, pressure-contact, preferably coaxial RF connections can be used, for example as disclosed in the documents U.S. Pat. No. 6,231, 352, U.S. Pat. No. 7,416,418, U.S. Pat. No. 7,210,941, EP-A2-1 289 076 or WO A1 2007/009549.

However, a different situation results with printed circuit board arrangements as shown in FIG. 1 or FIG. 2. In the case of the printed circuit board arrangement 10 shown in FIG. 1, two printed circuit boards 11 and 12 are arranged alongside one another on a common, relatively thick base plate 13 which is used in particular for heat dissipation and, for example, may be composed of aluminium. The two printed circuit boards 11 and 12 are aligned with two opposite edges parallel to one another, and separated, thus forming an intermediate space 14 between them, which must be bridged by RF-compatible electrical connections 15, which are represented schematically by double-headed arrows in FIG. 1. The intermediate space 14 is not absolutely essential, and instead the edges of the printed circuit boards 11, 12 can also directly abut on one another.

In the printed circuit board arrangement 20 shown in FIG. 2, the situation is similar, with the difference that one of the printed circuit boards, specifically the printed circuit board 12', is designed specifically for a high-power circuit and is therefore additionally provided on the lower face with a dissipation plate 16 which is intended to directly absorb and distribute the heat which is created in the components (a so-called "heat spreader plate"), before it is then passed on to the base plate 13'. By way of example, the dissipation plate 16 may be composed of sintered aluminium. This makes the printed circuit board 12' thicker than the printed circuit board 11. A corresponding thickness stage is provided for compensation in the base plate 13'.

Connection apparatuses which operate by means of pressure have already been proposed for the electrical connection of printed circuit boards arranged alongside one another, in U.S. Pat. No. 6,612,851, but these act on the upper face and lower face of the printed circuit boards and are therefore not suitable for printed circuit boards arranged on a base plate.

Furthermore, U.S. Pat. No. 6,464,510 has disclosed microwave connectors which connect both printed circuit boards on the upper face by means of pressure contacts. However, the connectors must be installed retrospectively and must be screwed to one or both printed circuit boards, which is tedious and susceptible to faults.

Finally, U.S. Pat. No. 3,591,834 discloses a type of plug connector system, in which the opposite side edges of the two printed circuit boards must be introduced from the side, making contact, into an apparatus which is provided for this purpose. This connection technique is also unsuitable for printed circuit boards which rest on a base plate.

SUMMARY OF THE INVENTION

The object of the invention is therefore to provide a printed circuit board arrangement of the type mentioned initially, in which RF-compatible electrical connections are made between the printed circuit boards in a simple and space-saving manner when the printed circuit boards are fitted on the base plate, and without any need for further additional tasks or reworking, and which electrical connections are suitable for use as signal lines up to the extremely high frequency range of several GHz.

The object is achieved by the totality of the features of claim 1. One major factor for the solution according to the invention is that the electrical connections are each made via at least one contact-making element, via which the printed circuit boards make detachable electrical contact with one another when fitted on the base plate.

One refinement of the apparatus according to the invention is characterized in that the electrical connections between the two printed circuit boards are made and are maintained by exerting mutual pressure between the printed circuit boards and/or by pressure between the printed circuit boards and the base plate. In this case, the contact is therefore not made in a clamping manner but by pressure exerted by the printed circuit boards.

The pressure can therefore act at right angles to the plane of the printed circuit boards. This is the case when the printed circuit boards press against a contact element arranged underneath them.

However, the pressure can also act parallel to the opposite edges of the printed circuit boards. This is the case when the printed circuit boards have contact apparatuses which overlap in the intermediate space.

According to a further refinement of the invention, at least one contact-making element is provided in order to make the electrical connections, is arranged in a recess in the base plate underneath the two printed circuit boards and detachably makes contact with and connects to one another the two printed circuit boards, from underneath.

One development of this refinement of the invention is distinguished in that the contact-making element has a contact rocker which is arranged and held with a centre piece in an insulating supporting body and projects upwards from the supporting body with a contact tongue, which is bent upwards, at each of the ends, and in that the supporting body is seated with the contact rocker in the associated recess in the base plate such that the contact tongues simultaneously press from underneath, making contact, against the printed circuit boards which are lying on the base plate.

The supporting body may be composed of widely differing insulating materials. However, the supporting body is preferably composed of an elastomer and is held in a clamping manner in the recess, with the contact rocker being held in a clamping manner in a depression on the upper face of the supporting body.

In this context, it has been proven for the recess to be in the form of an elongated hole, and for the edge contour of the supporting body to be matched to the edge contour of the recess.

A further refinement of the invention is characterized in that a contact surface is in each case provided on the lower face of both printed circuit boards for contact to be made by the contact tongues of the contact rocker, which contact surface is connected via a plated-through hole to a conductor track on the upper face of the printed circuit board.

According to another refinement, means are provided in order to hold down at least one of the printed circuit boards on the base plate, against the pressure of the contact rocker, in the area of the contact tongues.

A further refinement of the apparatus according to the invention is distinguished in that an intermediate space remains free between the two printed circuit boards, in that the contact rocker runs underneath the plane of the upper face of the base plate in the area of the intermediate space, and in that a vertical separating wall of an electrically conductive housing part is placed on the base plate, making contact with it, in the area of the intermediate space, such that the space above the two printed circuit boards is subdivided into two, separate, screened spaces, which are associated with the printed circuit boards.

However, it is also feasible for the contact-making element to have a further printed circuit board, on which contact posts are arranged in the area of the printed circuit boards and are conductively connected to one another via the further printed circuit board, and in that the further printed circuit board is seated with the contact posts in the associated recess in the base plate such that the contact posts press simultaneously, from underneath and making contact, against the printed circuit boards which are resting on the base plate. Contact posts such as those known from U.S. Pat. No. 6,231,352, for example, can be used for this purpose.

A refinement which does not require any action on the base plate is characterized in that an intermediate space remains free between the two printed circuit boards in that two contact-making elements are in each case provided in order to make the electrical connections and are arranged on the upper face of the two printed circuit boards such that they project from both sides into the intermediate space, make detachable contact, and connect the two printed circuit boards to one another.

The two contact-making elements are preferably the same, wherein each contact-making element is in the form of a stamped and bent part, which can be soldered on, and has a U-shaped body from which a sprung contact arm projects at the side, and is provided at its free end with a contact section, and wherein the contact sections of the two contact-making elements overlap in the intermediate space and press against one another in a sprung manner.

In particular, contact-making elements such as these are characterized in that they each have solder feet which are integrally formed on the body, in that an inclined element, which is bent obliquely outwards, is in each case integrally formed at the top in the contact sections, in that a conductor element, which is bent at right angles outwards, is in each case integrally formed at the bottom in the contact sections, and in that the contact sections enter the intermediate space from above.

Another refinement of the printed circuit board arrangement according to the invention is characterized in that the contact-making element has a contact body which is arranged and held with a base body in an insulating supporting body and at each of the ends has a contact tongue, which is bent back upwards, and projects upwards out of the supporting body, and in that the supporting body is seated with the contact body in the associated recess in the base plate such that the contact tongues at the same time press from underneath, making contact, against the printed circuit boards which are resting on the base plate.

In particular, the supporting body is composed of an elastomer and is held in a clamping manner in the recess.

The recess is preferably in the form of an elongated hole, and the edge contour of the supporting body is matched to the edge contour of the recess.

Advantageously, a contact surface is in each case provided on the lower face of the two printed circuit boards in order to make contact by means of the contact tongues of the contact body, and is connected via a plated-through hole to a conductor track on the upper face of the printed circuit board.

BRIEF DESCRIPTION OF THE DRAWINGS

The invention will be explained in more detail in the following text with reference to exemplary embodiments and in conjunction with the drawing, in which.

DESCRIPTION OF PREFERRED EMBODIMENTS

Figure 2:
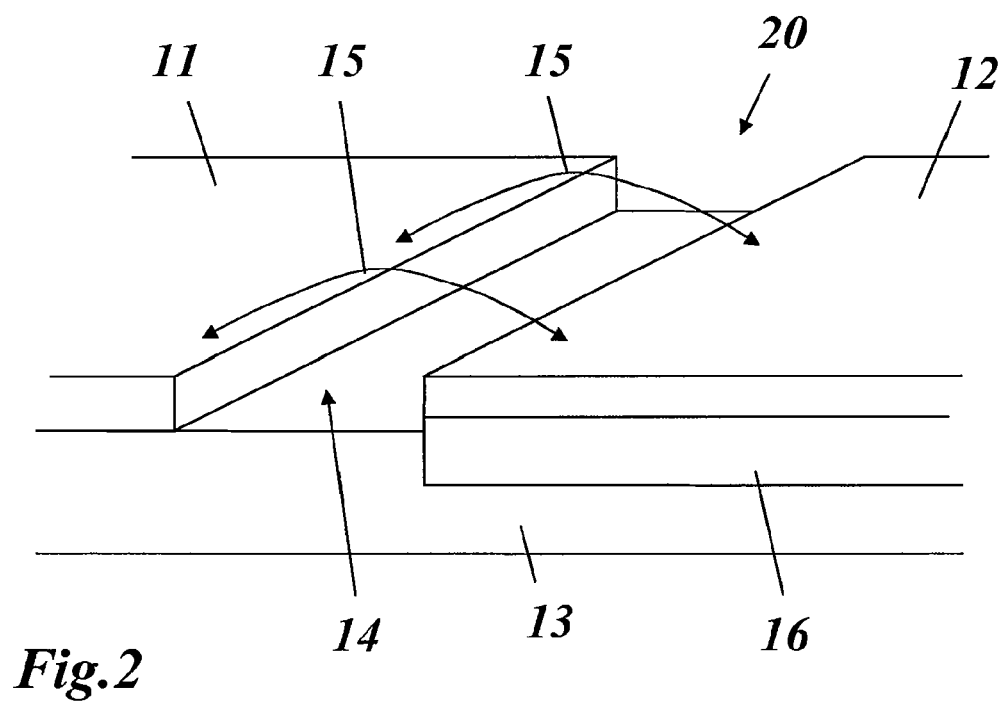
FIG. 2 shows a schematic illustration of the RF connection of two printed circuit boards, which rest on a common base plate, in a second configuration, on which the present invention is based.
Figure 3:
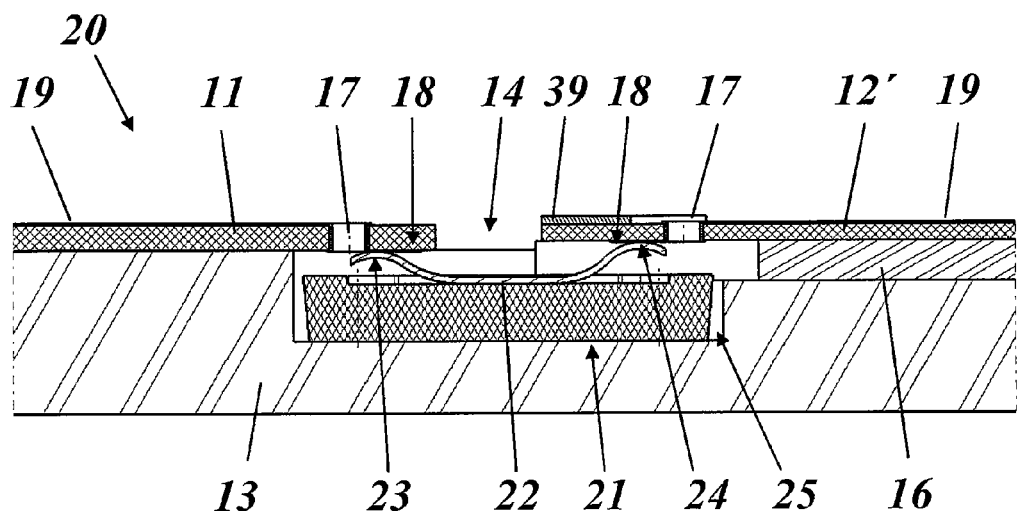
FIG. 3 shows a section illustration of a printed circuit board arrangement having two printed circuit boards, which are RF-connected via a contact-making element inserted into the base plate, according to a first exemplary embodiment of the invention.
Figure 4:
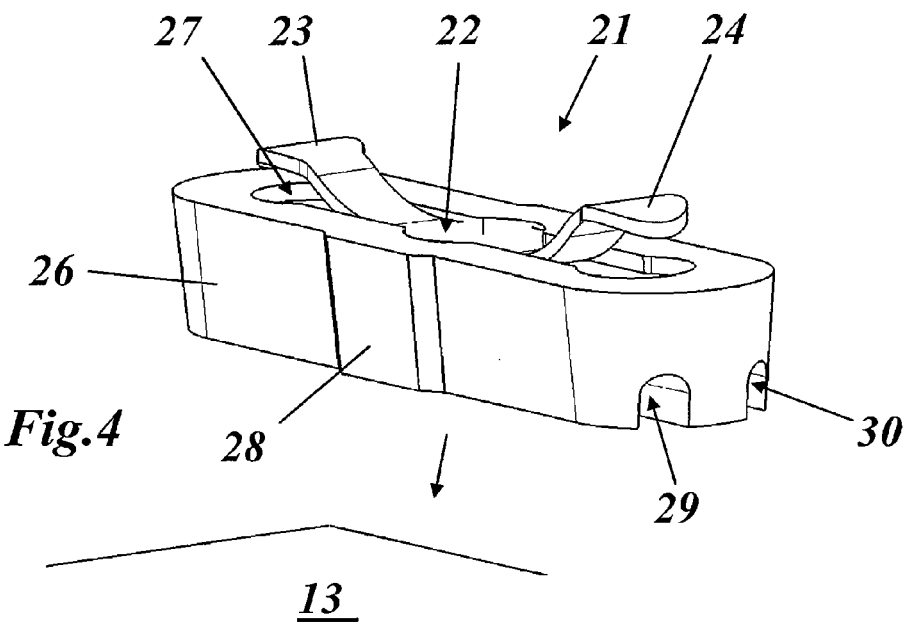
FIG. 4 shows a perspective illustration of the contact-making element, which can be inserted into the base plate, as shown in FIG. 3.

FIG. 3 shows a section illustration of a printed circuit board arrangement having two printed circuit boards, which are RF-connected via a contact-making element inserted into the base plate, according to a first exemplary embodiment of the invention. The printed circuit board arrangement 20, which has a base plate 13' of stepped thickness based on the principle illustrated in FIG. 2, comprises two printed circuit boards 11 and 12' of different thickness, with the thicker printed circuit board 12' being designed for higher thermal loads by means of a thermal dissipation plate 16, as already mentioned initially, on the lower face. The two printed circuit boards 11 and 12' rest, with a separation between them, on the base plate 13' arranged underneath, such that an intermediate space 14 remains free, which is bridged by a contact-making element 21 for each signal line, for the electrical connection of the two printed circuit boards 11, 12'.

Figure 5:
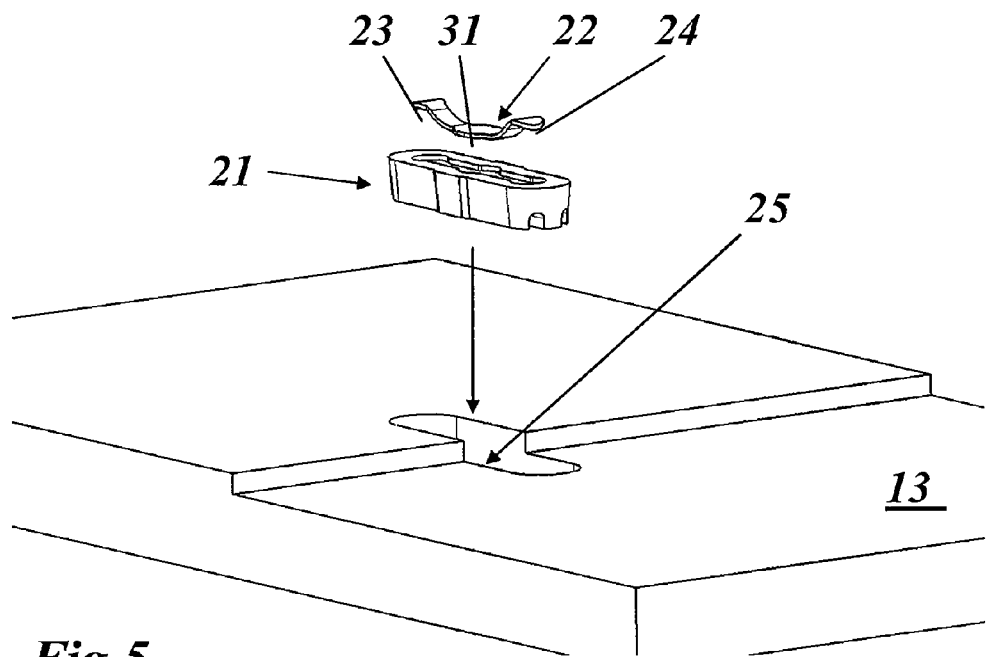
FIG. 5 shows an exploded illustration of the contact-making element from FIG. 4, above the base plate which is provided with a corresponding recess.

The contact-making element 21 in the exemplary embodiment shown in FIG. 3 is arranged underneath the two printed circuit boards 11, 12' and is integrated in the base plate 13'. For this purpose, a recess 25, which passes through underneath the intermediate space 13 and is in the form of an elongated hole with vertical side walls, is provided in the base plate 13', the elongated hole for example being machined or incorporated by casting in the base plate 13' (see also FIG. 5). The recess 25 accommodates the contact-making element 21 and holds it firmly, in a clamping manner. On the upper face, the contact-making element 21 contains an electrically conductive, sprung contact rocker 22 with a horizontal centre piece 31 (FIG. 5), which merges on opposite sides into contact tongues 23, 24 which are bent upwards.

The contact-making element 21 is designed and matched to the recess 25 such that, in the inserted state, it projects with the contact tongues 23, 24 of the contact rocker 22 so far upwards out of the recess 25 that the contact tongue 23 presses against the lower face of the printed circuit board 11, making contact, and the contact tongue 24 presses against the lower face of the printed circuit board 12', making contact, in an area in which the thermal dissipation plate 16 has been removed or omitted (FIG. 3). The contact rocker 22 is mounted in a depression 27 on the upper face of an electrically insulating supporting body 26. The supporting body 26 is composed of an electrically insulating material, preferably an elastomer, and forms a dielectric between the signal line (inner conductor), which is produced by the contact rocker 22, and the earth plane (outer conductor), which is formed by the base plate 13'.

The supporting body 26 tapers slightly conically downwards in order to allow it to be inserted more easily from above into the recess 25 (for example by means of a placement robot). The supporting body 26 is held in a clamping manner in the recess 25, by virtue of its elastic characteristics. In this case, two groove-like cutouts 29 and 30, which run in the longitudinal direction on the lower face of the supporting body 26, have a supporting effect. The contact rocker 22 is a stamped and bent part, is preferably manufactured from spring bronzes, and has surface finishing, for example silver coating.

The depression 27 on the upper face of the supporting body 26 is matched in the edge contour to the contact rocker 22. The depression 27 in the area of the broadened centre piece 31 of the contact rocker 22 is designed such that the contact rocker 22, which is pushed into the depression 27, is pressed in with the side edges of the centre piece 31 at the side into the supporting body 26, and is therefore held securely in the supporting body 26. This interlock between the centre piece 31 and the supporting body 26 is assisted by broadened areas 28 of the supporting body 26, which are fitted at the side and produce additional pressure inwards on insertion into the recess 25.

Figure 6:
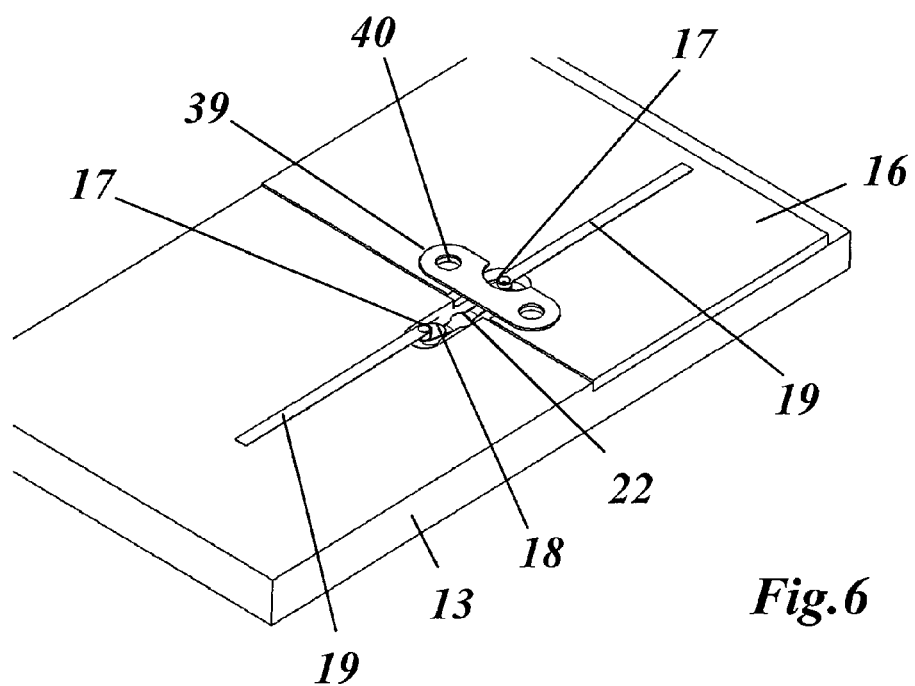
FIG. 6 shows a perspective view from above of the electrical connecting path in the arrangement shown in FIG. 3, with the supporting material for the printed circuit boards being omitted, for the sake of visibility.

Contact surfaces 18 (contact pads) are arranged on the lower faces of the printed circuit boards 11 and 12' in order to make contact with the contact rocker 22, and are electrically connected via plated-through holes 17 (vias) to conductor tracks 19 on the upper face of the printed circuit boards 11, 12' (see also FIG. 6). The conductor tracks 19, the plated-through holes 17, the contact surfaces 18 and the contact rocker 22 thus form the inner conductor of an RF-compatible signal line, via which the two printed circuit boards 11, 12' are connected to one another after their installation.

In the situation in which the printed circuit boards 11, 12' do not withstand, in the long term, the pressure exerted from underneath by the contact rocker 22 and become deformed, a mechanically robust holding plate 39, which extends transversely over the contact-making area, can be provided, as shown in FIG. 6, on upper face of the respective printed circuit board 11 or 12', and is screwed to the base plate 13' via attachment holes 40 which penetrate as far as the base plate 13'. This may be necessary in particular for the printed circuit board 12', because the lack of the stabilizing dissipation plate 16 in the area of the contact-making element 21 means that the remaining layer structure is less robust.

Figure 11:
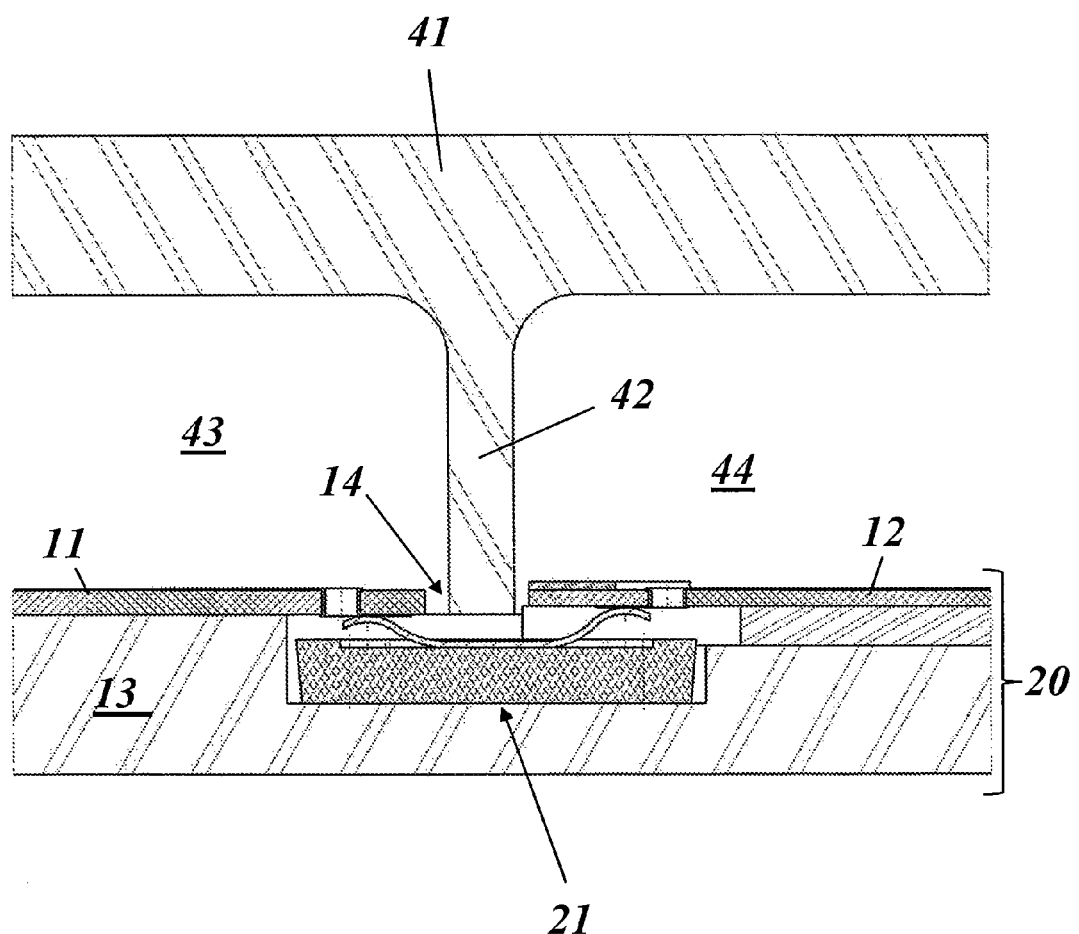
FIG. 11 shows the printed circuit board arrangement as shown in FIG. 3, as part of a screened RF assembly.
Figure 12:
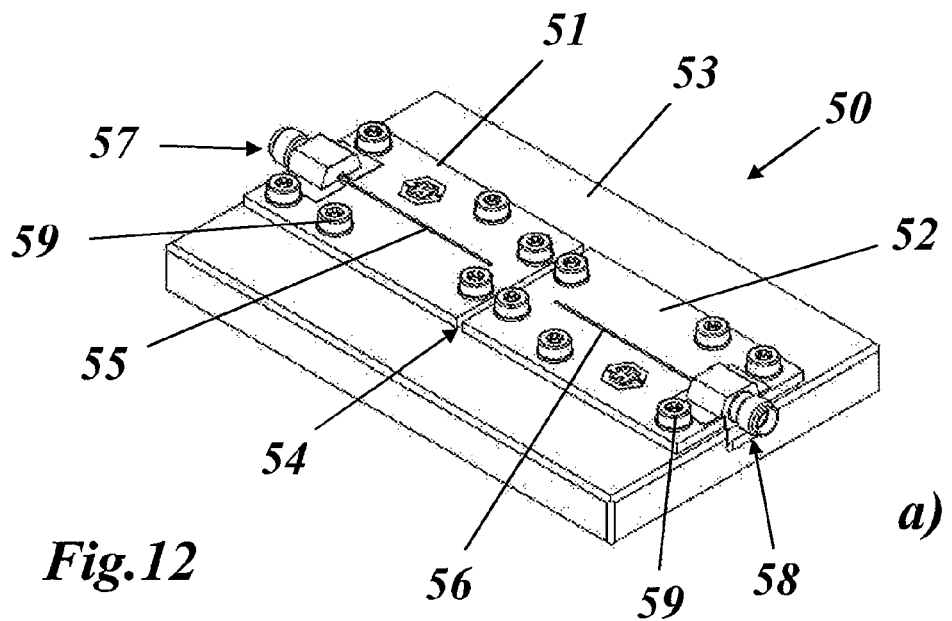
FIG. 12 uses a plurality of sub-FIGS. 12(*a*), 12(*b*) and 12(*c*) to show various views (perspective side view, plan view from above, longitudinal section) of a further exemplary embodiment of the invention.
Figure 12:
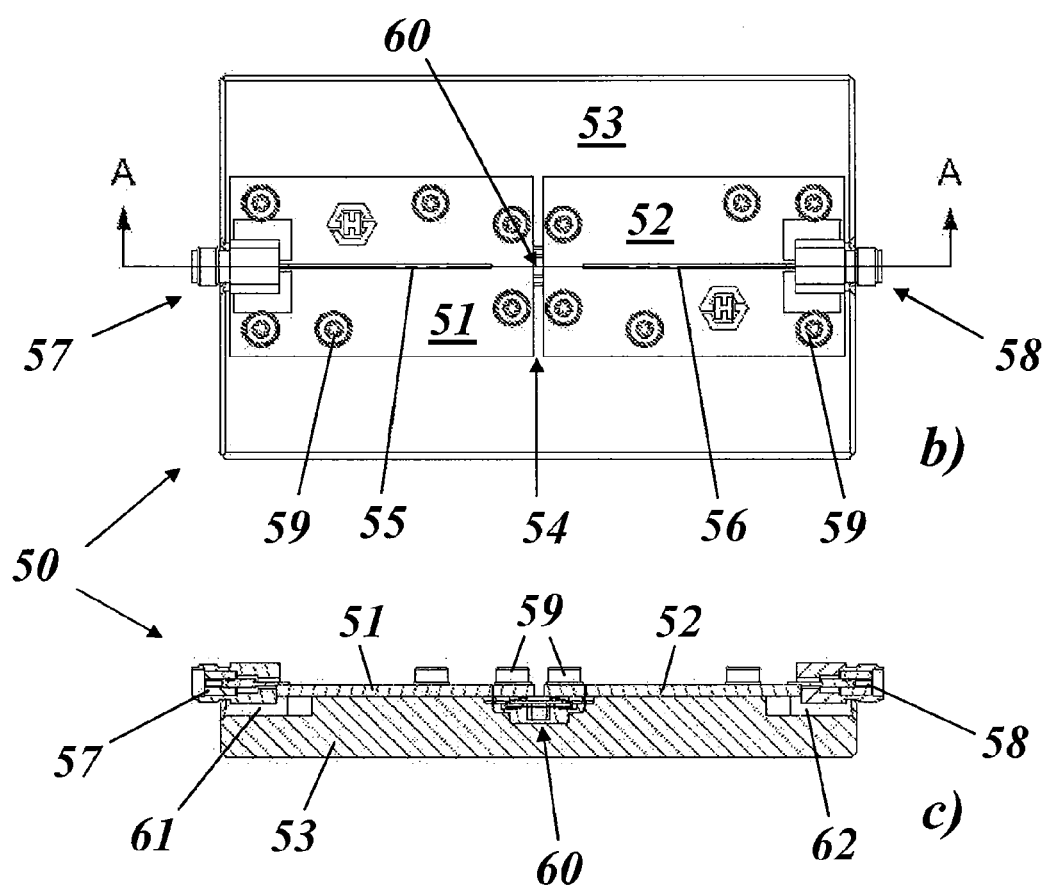

The contact-making element 21, which is integrated in the base plate 13' underneath the printed circuit boards 11, 12', advantageously makes it possible, as shown in FIG. 11, to place the vertical separating wall 42 of an electrically conductive housing part 41 directly in the intermediate space 14 and over the complete area onto the base plate 13', thus subdividing the space above the printed circuit board arrangement 20 into two screened spaces 43 and 44, such that the circuit on the printed circuit board 11 is RF-isolated from the circuit on the printed circuit board 12', and they are connected to one another only by the contact-making elements 21.

Figure 1:
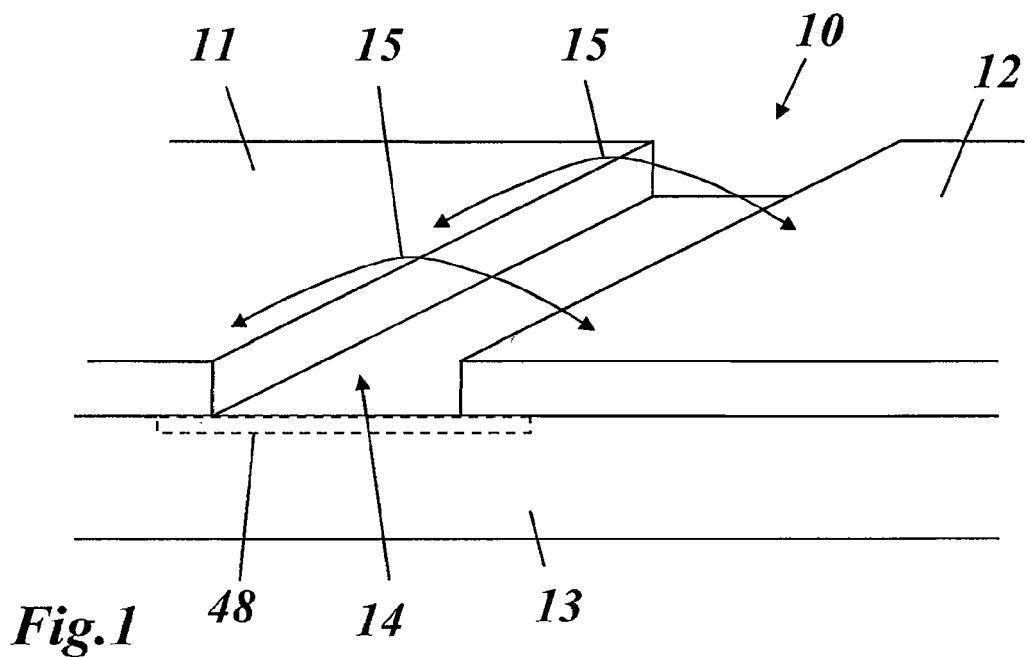
FIG. 1 shows a schematic illustration of the RF connection of two printed circuit boards, which rest on a common base plate, in a first configuration, on which the present invention is based.

For complete electromagnetic screening of the contact rocker even without housing part 41, the base plate 13 may contain a further depression at the upper edge of the recess 25, which depression holds a screening body 48. This screening body 48, preferably a screening plate, is designed such that it projects under the respective front edge of the printed circuit boards 11, 12, and thus produces a coherent electrically conductive connection to the metallization on the printed circuit boards. For this purpose, the structure of the base plate 13 and the arrangement of the printed circuit boards 11, 12 can preferably be chosen to result in a horizontal plane, in order to avoid a step in the screening body 48 (the screening body 48, with its layer, is shown by way of example by dashed lines in FIG. 1). The printed circuit board arrangement shown in FIGS. 3-6 and 11 is distinguished by the following characteristic properties and advantages:

The connection between the printed circuit boards has very good RF characteristics.

As a result of the direct contact with the base plate, it allows optimum screening of the individual printed circuit boards (FIG. 11).

No contact arms project at the side from the densely fitted printed circuit boards.

The connection is very position-tolerant: the contact force is independent of movements of the printed circuit boards on the board plane (x-y plane); the contact rocker and supporting body contribute to the build-up of the contact forces, because of their elastic characteristics.

The contact rocker and the supporting body can, to a certain extent, compensate for height tolerances of the printed circuit boards.

The standard rules can be applied without any restriction for the design of the circuitry of the printed circuit boards, and in particular the RF characteristics can be optimized.

The capability to transmit direct current via the contact-making elements 21 can be enhanced by the use of a plurality of vias on each side.

The mechanical robustness of PTFE printed circuit boards can be enhanced by the screwed-on holding plates 39.

Different lengths of the connections can be implemented.

The capability to transmit direct current by the connections can be selected virtually without restriction.

The connections represent a virtually ideal 50-Ohm environment, without RF band limiting, up to the coaxial frequency limit (for example 4 GHz).

The connections are insensitive to any change in the position of the printed circuit boards during fitting, and there is therefore no need for any guide pins; tolerances can easily be coped with by appropriate design of the contact pads 18.

The arrangement is mechanically robust.

The contact rocker is a simple stamped and bent part.

Because of the self-clamping, the fitting of the contact-making element 21 in the base plate is simple.

Before fitting, the contact-making elements 21 can be protected in a simple manner with a covering cap.

The printed circuit boards can be handled and fitted particularly easily: putting in place and screwing tight.

No specific placement sequence is required during construction of the printed circuit boards.

The modules can be repaired and replaced easily and quickly.

The effort required to provide the necessary recesses in the base plate and in the dissipation plate is minor.

Because of the earth line above the base plate 13 or 13', no screening cover is required to test the connection (housing part 41 in FIG. 11).

Figure 10:
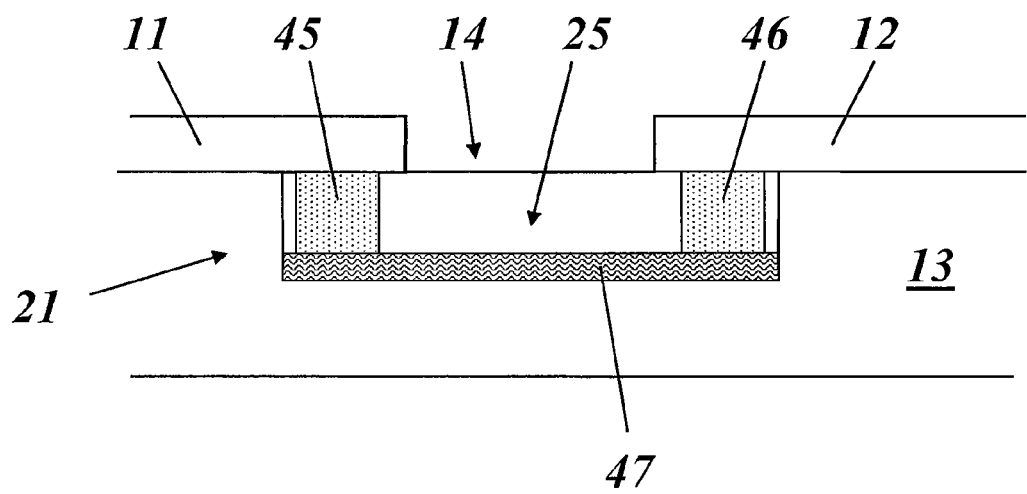
FIG. 10 shows a third exemplary embodiment of the invention, comparable to FIG. 3, in which contact posts which are known per se are used.

However, as is indicated by way of example in FIG. 10—a contact-making element 21' can also be integrated in the base plate 13 (or 13') instead of the contact-making element 21 equipped with the contact rocker 22, which contact-making element 21' uses contact-making posts 45, 46, for example as described in the initially cited document U.S. Pat. No. 6,231,352, and as commercially available. The two contact-making posts 45, 46 are soldered by the solder face onto a further printed circuit board 47, which is in the form of a strip, and are thus electrically connected to one another. The unit comprising the printed circuit board 47 and the contact-making posts 45, 46 is inserted into the recess 25 such that the pressure contacts of the contact-making posts 45, 46 are pushed from underneath against the printed circuit boards 11 and 12, making contact, when they are placed onto the base plate 13.

Figure 7:
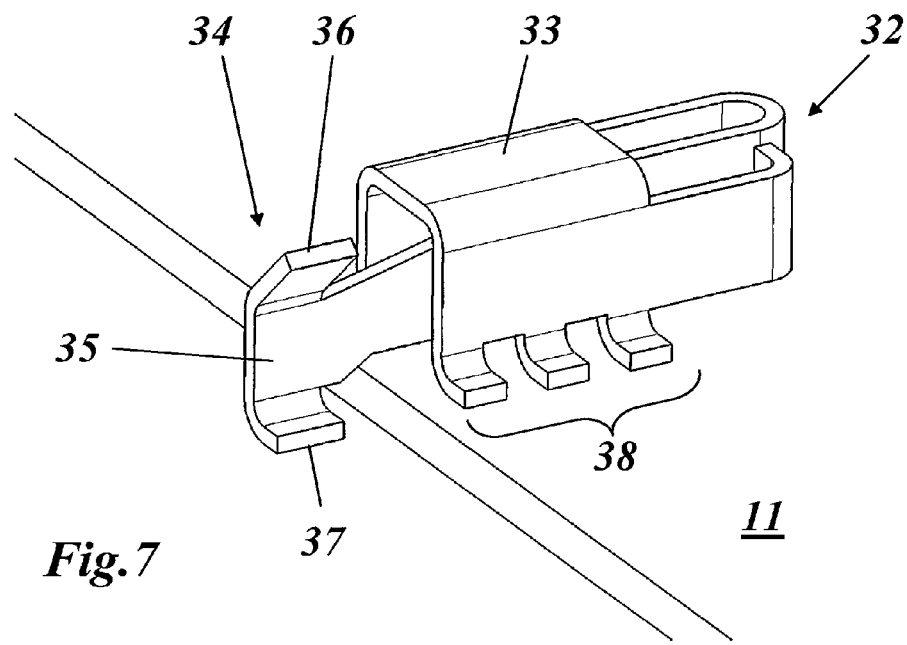
FIG. 7 shows a printed circuit board with a soldered-on contact-making element for a printed circuit board arrangement according to a second exemplary embodiment of the invention.
Figure 8:
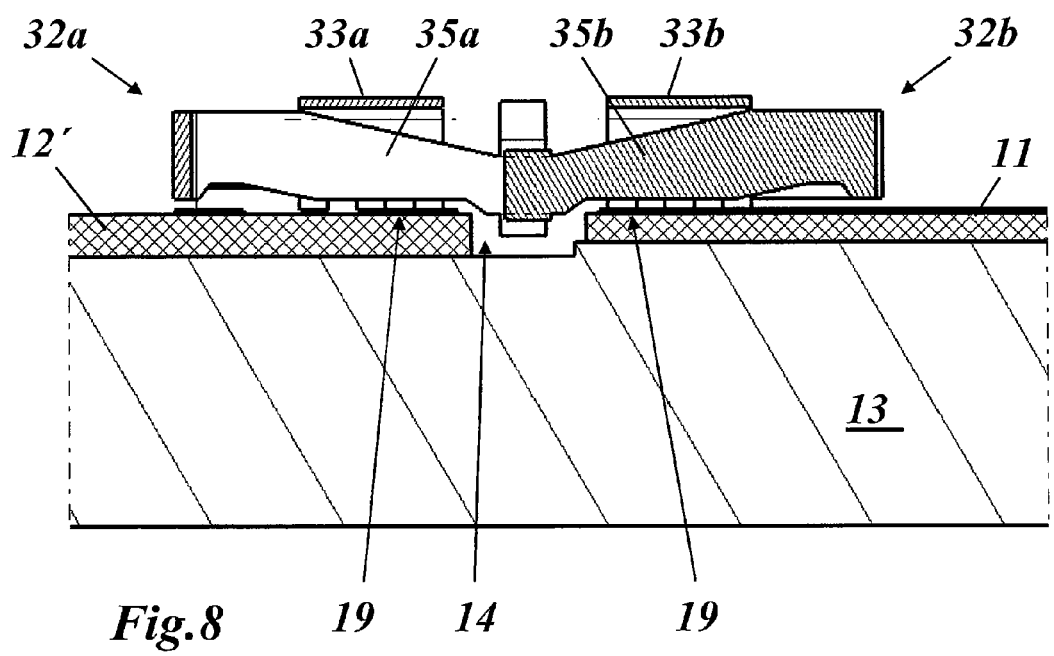
FIG. 8 shows a section illustration, comparable to FIG. 3, of a printed circuit board arrangement having two printed circuit boards, which are RF-connected via contact-making elements as shown in FIG. 7, according to the second exemplary embodiment of the invention.
Figure 9:
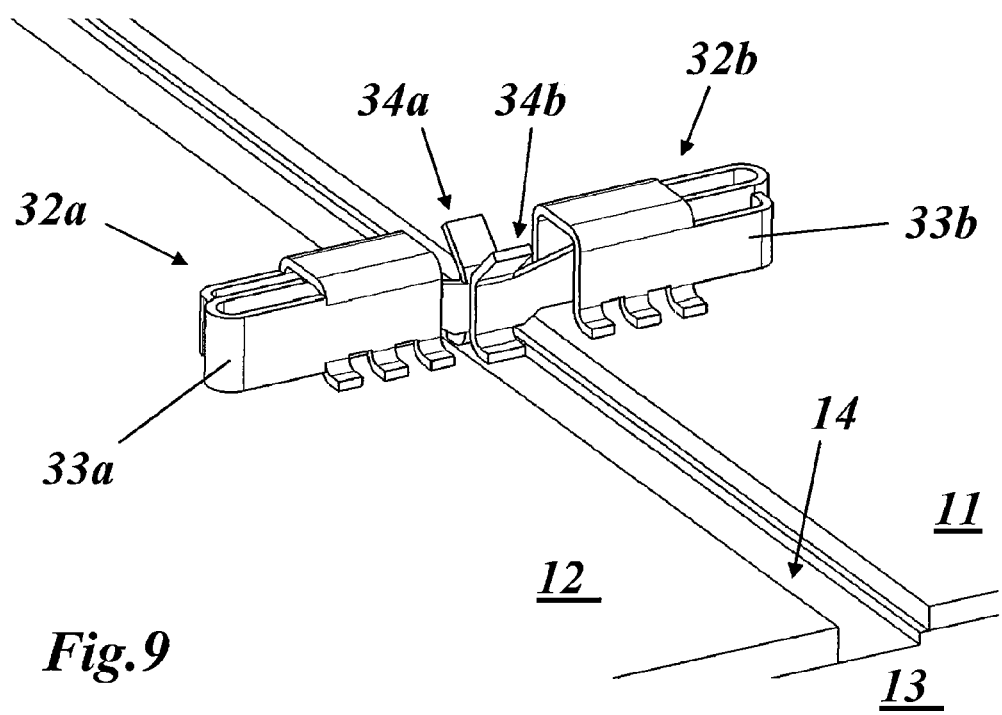
FIG. 9 shows a perspective view from above of the printed circuit board arrangement as shown in FIG. 8.

Another embodiment of the printed circuit board arrangement according to the invention is illustrated in FIGS. 7 to 9: in this case, two identical contact-making elements 32 or 32a and 32b are used which are soldered, in each case rotated through 180°, onto a corresponding conductor track on the upper face of the printed circuit boards 11 and 12', and project with a respective contact arm 35 or 35a and 35b, which is sprung on the board plane, overlapping one another, into the intermediate space 14 (FIGS. 8, 9). The contact-making elements 32, which are preferably in the form of stamped and bent parts and are produced from spring bronze, have a U-shaped body 33 or 33a, 33b, on whose limbs solder feet 38 are integrally formed. Starting from the body 33, the contact arm 35 first of all extends to the rear, makes a 180° bend, and is passed out through the interior of the body 33 forwards, in order to allow an adequate length for the arm. A contact section 34 is formed at the free end of the contact arm 35, comprising an approximately square contact surface to which an inclined element 36 which is bent outwards obliquely (through 30°-45°) is connected at the top, and a conductor element 37, which is bent outwards at right angles, is connected at the bottom.

The contact arms 35a, 35b of the two contact-making elements 32a, 32b of one connection overlap and make contact with one another by pressure, which is exerted parallel to the board edge, in the intermediate space 14 with the square contact surface which, by virtue of its expansion, allows tolerance for position errors of the printed circuit boards 11, 12'. The inclined elements 36 make it easier to insert the two contact-making elements 32a, 32b into one another during the fitting of the printed circuit boards 11, 12'. The conductor elements 37 improve the electrical characteristics of the connection in conjunction with the outer conductor, which is passed over the base plate 13'. The recess in the area of the intermediate space in the contact arms 35a, 35b is also used for the same purpose. In the same way as other components, the contact-making elements 32a, 32b can be mounted on the printed circuit boards 11, 12' using conventional surface mounted device solder technology, and can be provided on belts for appropriate automatic devices. They can be used to transmit signals up to a frequency of 4 GHz. Holding pins can be provided in order to increase the mechanical strength of the arrangement, and are plugged into corresponding holes on the printed circuit board. These holding bolts can either directly integrated in the stamped and bent body, or are integrated in a surrounding insulating body, in order to improve the RF characteristics. This insulating body can preferably be designed using plastic injection-moulding insert technology.

The characteristic features and advantages of this embodiment are as follows:

The contact-making elements are very small and do not occupy much space.

The contact-making elements are symmetrical, and are the same for both printed circuit boards.

The contact-making elements are simple stamped and bent parts.

They can be partially plated.

They do not require any changes to the base plate or the dissipation plate.

Because of the earth line which is provided above the respective base plate 13 or 13', no screening cover is required for testing the connection (analogously to the housing part 41 in FIG. 11).

Figure 13:
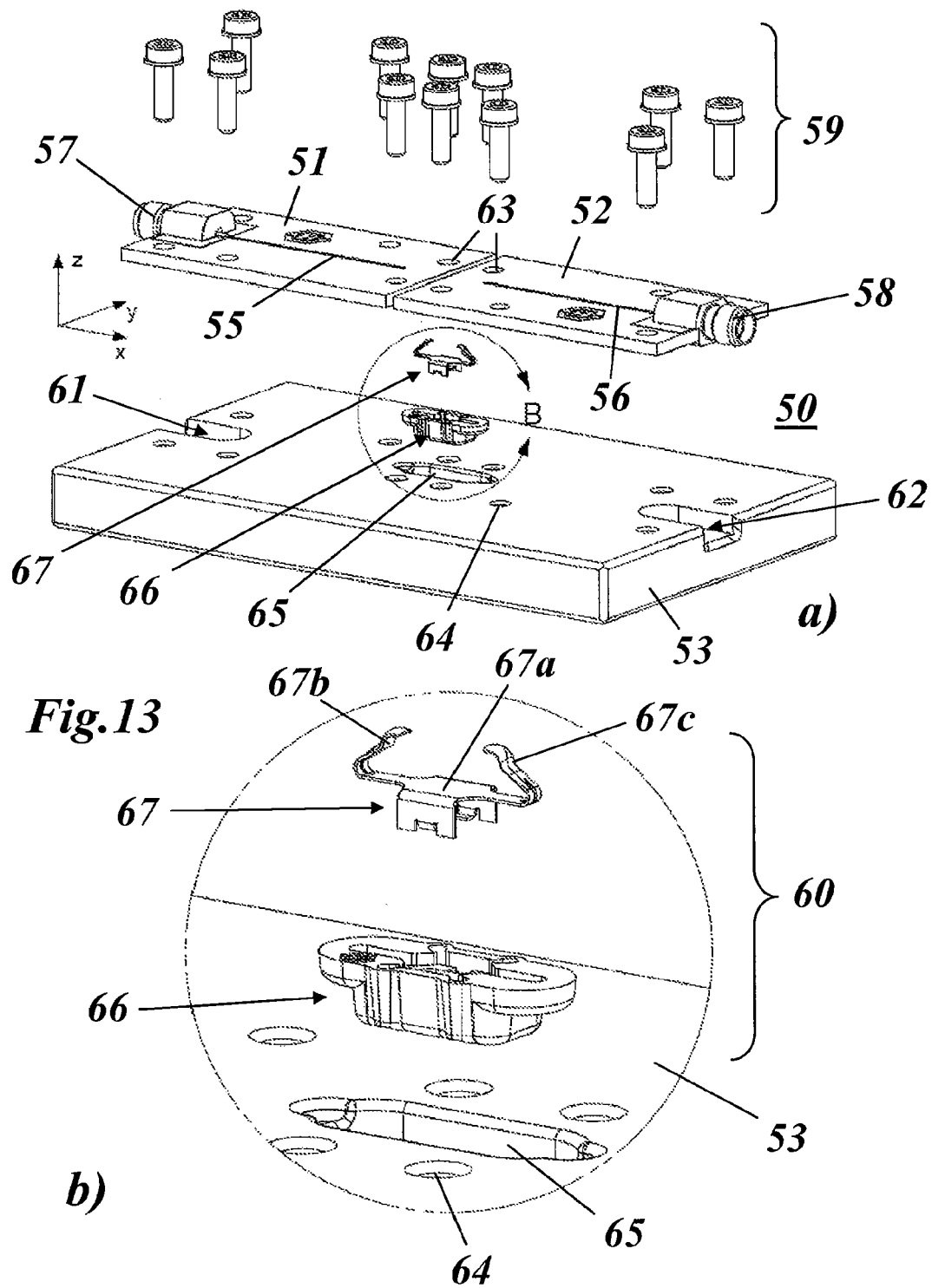
FIG. 13 shows an exploded illustration (13(*a*)) and an enlarged detail (13(*b*)) of the printed circuit board arrangement shown in FIG. 12.
Figure 14:
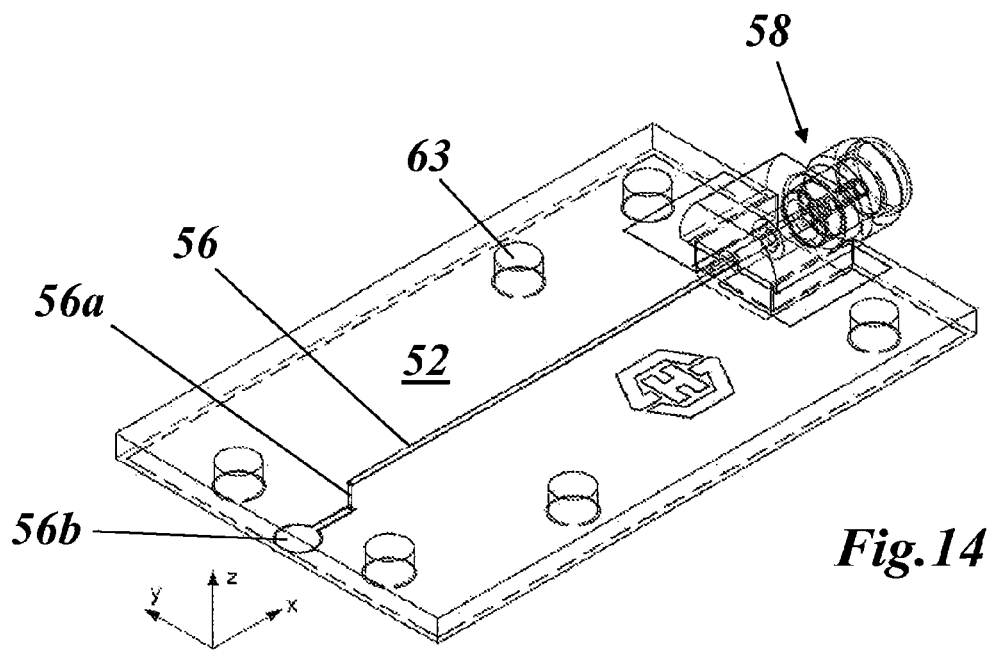
FIG. 14 shows a perspective view obliquely from above on one of the printed circuit boards shown in FIG. 12.
Figure 15:
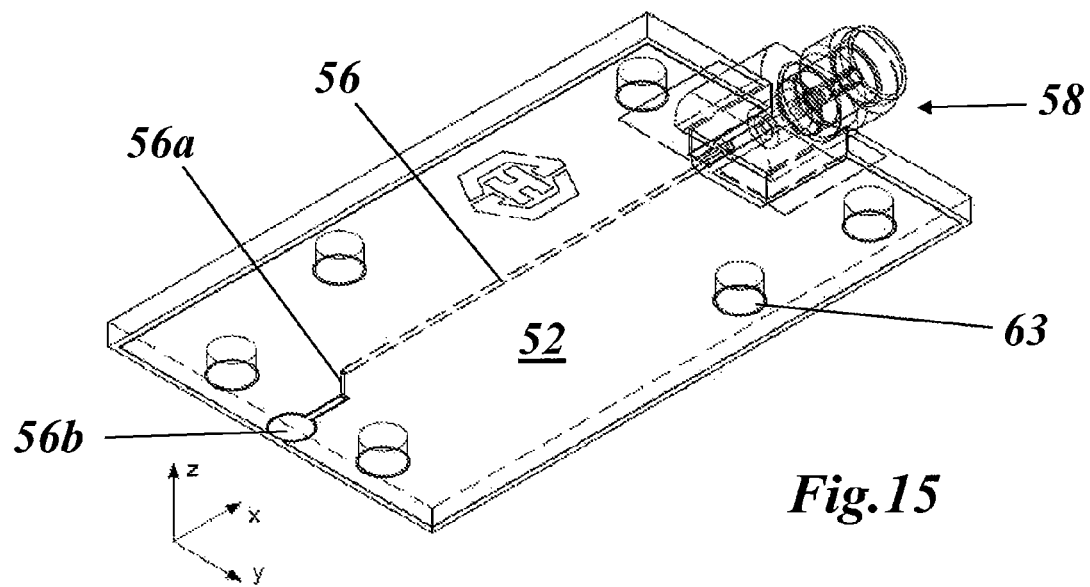
FIG. 15 shows a perspective view obliquely from underneath of the printed circuit board shown in FIG. 14.

A further exemplary embodiment of the invention is illustrated in FIGS. 12-15. The printed circuit board arrangement 50 in this exemplary embodiment is based on a rectangular base plate 53, on whose upper face two printed circuit boards 51, 52 are detachably mounted (screwed on). The two printed circuit boards 51, 52 are designed to be of the same type, but are mounted on the base plate 53 in mirror image form with respect to one another. On the sides with which they abut against one another forming an intermediate space 54, the two printed circuit boards 51, 52 are connected to one another for RF purposes by means of a contact-making element 60 which is arranged recessed in the base plate 53. Each of the two printed circuit boards 51, 52 is designed as illustrated in FIG. 14 and FIG. 15. An externally accessible connecting socket 57, 58 is arranged on the respective outer narrow faces of the printed circuit boards 51, 52, and a corresponding line can be connected to these connecting sockets 57, 58. A central conductor track 55, 56, which runs in the longitudinal direction, leads to the other narrow face of the printed circuit board from the connecting socket 57, 58 on the upper face of the printed circuit board 51, 52, on which narrow face it is conductively connected by means of a plated-through hole (56*a* in FIGS. 14, 15) to a contact surface (pad) 56*b* which is provided on the lower face of the printed circuit board. The contact-making element 60, which is arranged under the printed circuit board 51, 52, makes contact with the contact surfaces 56*b* of the two printed circuit boards 51, 52, producing a conductive connection between the two printed circuit boards 51, 52.

The contact-making element 60 is designed as shown in FIG. 13(*b*). A contact body 67 is provided within the contact-making element 60 for making contact with and conductive connection of the two pads (56*b*) on the printed circuit boards 51, 52, which contact body 67 is in the form of a stamped-and-bent part and has a base body 67*a* from which two contact tongues 67*b*, 67*c*, which are bent back upwards, extend in mirror-image form on opposite sides. The contact body 67 is mounted in an electrically isolated form and fixed (not rocking) in a supporting body 66 which is in the form of a trough and is itself inserted into a corresponding recess 65 in the base plate 53.

The two printed circuit boards 51, 52 are each provided with holes 63, which are arranged in a distributed manner, and which correspond with threaded holes 64 in the base plate 53. The printed circuit boards 51, 52 are mounted on the base plate 53 by means of a plurality of screws 59, which are passed through the holes 63 in the printed circuit boards 51, 52 and are screwed into the threaded holes 64. Appropriate recesses 61, 62 are provided on the base plate 53 in order to create space for the connecting socket 57, 58 which projects downwards out of the printed circuit boards 51, 52.

The geometry of the arrangement 50 is chosen such that the contact surfaces 56*b* which are located on the lower face of the printed circuit boards 51, 52 which are mounted on the base plate 53 press in a sprung manner downwards against the contact tongues 67*b, c* of the contact-making element 60 and thus create a secure and permanent electrical contact via the contact body 67 between the two printed circuit boards 51, 52, to be precise the two conductor tracks 55, 56.

International Patent Application PCT/EP2010/056733, filed 17 May 2010 and Swiss Patent Reference 838/09, filed 2 Jun. 2009, the priority documents corresponding to this invention, to which a foreign priority benefit is claimed under Title 35, United States Code, Section 119, and their entire teachings are incorporated, by reference, into this specification.

The invention claimed is:

1. A printed circuit board arrangement (10, 20, 50) comprising:
   at least two printed circuit boards (11; 12, 12'; 51, 52), which are located alongside one another on a common, electrically conductive base plate (13, 13'; 53), the at least two printed circuit boards with two mutually opposite edges connected to one another by means of electrical connections (21; 21', 32*a*, 32*b*; 60) for transmission of extremely high frequencies, wherein the electrical connections are each made via at least one contact-making element (21; 21', 32*a*, 32*b*; 60), via which the printed circuit boards make detachable electrical contact with one another when mounted on the base plate (13, 13'; 53).

2. The printed circuit board arrangement according to claim 1, wherein the electrical connections between the two printed circuit boards (11; 12, 12'; 51, 52) are made and are maintained by at least one of exerting mutual pressure between the printed circuit boards (11; 12, 12') and by pressure between the printed circuit boards (11; 12, 12'; 51, 52) and the base plate (13, 13'; 53).

3. The printed circuit board arrangement according to claim 2, wherein the pressure acts at right angles to the plane of the printed circuit boards (11; 12, 12'; 51, 52).

4. The printed circuit board arrangement according to claim 2, wherein the pressure acts parallel to the opposite edges of the printed circuit boards (11; 12, 12').

5. The printed circuit board arrangement according to claim 3, wherein at least one contact-making element (21; 21'; 60) is arranged in a recess (25; 65) in the base plate (13, 13', 53) underneath the two printed circuit boards (11; 12, 12'; 51, 52) and detachably makes contact with and connects to one another the two printed circuit boards (11; 12, 12'; 51, 52), from underneath.

6. The printed circuit board arrangement according to claim 5, wherein the contact-making element (21) includes a contact rocker (22) arranged and held with a centre piece (31) in an insulating supporting body (26) and projects upwards from the supporting body (26) with a contact tongue (23, 24), which is bent upwards, at each of the ends, wherein the supporting body (26) is seated with the contact rocker (22) in an associated recess (25) in the base plate (13, 13') such that the contact tongues (23, 24) simultaneously press from underneath, making contact, against the printed circuit boards (11; 12, 12') which are lying on the base plate (13, 13').

7. The printed circuit board arrangement according to claim 6, wherein the supporting body (26) comprises an elastomer, wherein the supporting body (26) is held in a clamping manner in the recess (25), and in that the contact rocker (22) is held in a clamping manner in a depression (27) on the upper face of the supporting body (26).

8. The printed circuit board arrangement according to claim 7, wherein the recess (25) is in the form of an elongated hole, and an edge contour of the supporting body (26) is matched to an edge contour of the recess (25).

9. The printed circuit board arrangement according to claim 6, wherein a contact surface (18) is in each case provided on a lower face of both printed circuit boards (11; 12, 12') for contact to be made by the contact tongues (23, 24) of the contact rocker (22), which contact surface (18) is connected via a plated-through hole (17) to a conductor track (19) on an upper face of the printed circuit board (11; 12, 12').

10. The printed circuit board arrangement according to one of claims 6 to 9, wherein means (39, 40) are provided to hold down at least one of the printed circuit boards (11; 12, 12') on the base plate (13, 13'), against the pressure of the contact rocker (22), in the area of the contact tongues (23, 24).

11. The printed circuit board arrangement according to claim 6, wherein an intermediate space (14) remains free between the two printed circuit boards (11; 12, 12'), in that the contact rocker (22) runs underneath a plane of an upper face of the base plate (13, 13') in an area of the intermediate space (14), and in that a vertical separating wall (42) of an electrically conductive housing part (41) is placed on the base plate (13, 13'), making contact with it, in the area of the intermediate space (14), such that a space above the two printed circuit boards (11; 12, 12') is subdivided into two, separate, screened spaces (43, 44), which are associated with the printed circuit boards (11; 12, 12').

12. The printed circuit board arrangement according to claim 5, wherein the contact-making element (21') has a further printed circuit board (47), on which contact posts (45, 46) are arranged in an area of the printed circuit boards (11; 12, 12') and are conductively connected to one another via the further printed circuit board (47), and wherein the further printed circuit board (47) is seated with the contact posts (45, 46) in an associated recess (25) in the base plate (13, 13') such that the contact posts (45, 46) press simultaneously, from underneath and making contact, against the printed circuit boards (11; 12, 12') which are resting on the base plate (13, 13').

13. The printed circuit board arrangement according to claim 4, wherein an intermediate space (14) remains free between the two printed circuit boards (11; 12, 12'), in that two contact-making elements (32; 32a, 32b) are in each case provided to make the electrical connections and are arranged on an upper face of the two printed circuit boards (11; 12, 12') such that they project from both sides into the intermediate space (14), make detachable contact, and connect the two printed circuit boards (11; 12, 12') to one another.

14. The printed circuit board arrangement according to claim 13, wherein the two contact-making elements (32; 32a, 32b) are the same, in that each contact-making element (32; 32a, 32b) is in a form of a stamped and bent part, which can be soldered on, and has a U-shaped body (33; 33a, 33b) from which a sprung contact arm (35; 35a, 35b) projects at the side, and is provided at its free end with a contact section (34), and in that contact sections (34) of the two contact-making elements (32; 32a, 32b) overlap in the intermediate space (14) and press against one another in a sprung manner.

15. The printed circuit board arrangement according to claim 14, wherein the contact-making elements (32; 32a, 32b) each have solder feet (38) which are integrally formed on the body (33; 33a, 33b), in that an inclined element (36), which is bent obliquely outwards, is in each case integrally formed at the top in the contact sections (34), in that a conductor element (37), which is bent at right angles outwards, is in each case integrally formed at a bottom in the contact sections (34), and in that the contact sections (34) enter the intermediate space (14) from above.

16. The printed circuit board arrangement according to claim 5, wherein the contact-making element (60) includes a contact body (67) arranged and held with a base body (67a) in an insulating supporting body (66) and at each end has a contact tongue (67b, 67c), which is bent back upwards, and projects upwards out of the supporting body (66), and in that the supporting body (66) is seated with the contact body (67) in an associated recess (65) in the base plate (53) such that the contact tongues (67b, 67c) at the same time press from underneath, making contact, against the printed circuit boards (51, 52) which are resting on the base plate (53).

17. The printed circuit board arrangement according to claim 16, wherein the supporting body (66) comprises an elastomer, and the supporting body (66) is held in a clamping manner in the recess (65).

18. The printed circuit board arrangement according to claim 17, wherein the recess (65) comprises an elongated hole, and an edge contour of the supporting body (66) is matched to an edge contour of the recess (65).

19. The printed circuit board arrangement according to claim 16, wherein a contact surface (56b) is in each case provided on a lower face of the two printed circuit boards (51, 52) in order to make contact by means of the contact tongues (67b, 67c) of the contact body (67), and is connected via a plated-through hole (56a) to a conductor track (55, 56) on an upper face of the printed circuit board (51, 52).

* * * * *